(12) United States Patent
Dong

(10) Patent No.: US 12,543,562 B2
(45) Date of Patent: Feb. 3, 2026

(54) CAPACITIVE ISOLATOR AND METHOD FOR MANUFACTURING THEREOF

(71) Applicant: 2Pai Semiconductor (Shanghai) Co. Ltd, Shanghai (CN)

(72) Inventor: Zhiwei Dong, Shanghai (CN)

(73) Assignee: 2PAI SEMICONDUCTOR (SHANGHAI) CO. LTD, Shanghai (CN)

( * ) Notice: Subject to any disclaimer, the term of this patent is extended or adjusted under 35 U.S.C. 154(b) by 502 days.

(21) Appl. No.: 18/167,770

(22) Filed: Feb. 10, 2023

(65) Prior Publication Data

US 2024/0213142 A1 Jun. 27, 2024

Related U.S. Application Data

(63) Continuation of application No. PCT/CN2023/074850, filed on Feb. 7, 2023.

(30) Foreign Application Priority Data

Dec. 27, 2022 (CN) .......................... 202211680023.2

(51) Int. Cl.
*H01L 23/522* (2006.01)
*H01L 21/762* (2006.01)
*H01L 21/768* (2006.01)
*H01L 23/528* (2006.01)

(52) U.S. Cl.
CPC .... *H01L 23/5223* (2013.01); *H01L 21/76224* (2013.01); *H01L 21/76802* (2013.01); *H01L 23/5283* (2013.01)

(58) Field of Classification Search
CPC .......... H01L 23/5223; H01L 21/76224; H01L 23/48; H01L 23/642; H01L 2924/19041; H01L 25/0655; H01L 2224/48137; H01L 2224/48195; H01L 2224/48265; H01L 2924/19104; H01L 21/76802; H10D 1/68
See application file for complete search history.

(56) References Cited

U.S. PATENT DOCUMENTS

| 9,087,853 B2 * | 7/2015 | Tao ...................... H01L 23/481 |
| 10,074,713 B1 * | 9/2018 | Briano .................. H01L 23/642 |
| 2005/0202638 A1 * | 9/2005 | Yang .................... H10D 84/038 |
| | | 438/294 |
| 2014/0145297 A1 * | 5/2014 | Daamen .............. H01L 23/5223 |
| | | 438/386 |
| 2017/0098604 A1 * | 4/2017 | Ho ....................... H01L 23/5225 |
| 2018/0045764 A1 * | 2/2018 | Heinrich .............. H10D 62/115 |
| 2021/0020564 A1 * | 1/2021 | West ..................... H01L 23/645 |

* cited by examiner

*Primary Examiner* — Sonya McCall-Shepard
(74) *Attorney, Agent, or Firm* — Quarles & Brady LLP

(57) ABSTRACT

A capacitive isolator is developed. Embodiments of the capacitive isolator include a substrate; a shallow trench isolation region coupled to the substrate; a polysilicon layer disposed above the shallow trench isolation region; a bottom metal plate disposed above the polysilicon layer; one or more lower dielectric layers above the bottom metal plate; an intermediate metal plate disposed above the one or more lower dielectric layers; and a top metal plate disposed above the intermediate metal plate. A semiconductor device including two capacitive isolators and an isolation structure disposed between the two capacitive isolators is also developed.

19 Claims, 7 Drawing Sheets

CAPACITIVE ISOLATOR AND METHOD FOR MANUFACTURING THEREOF

CROSS-REFERENCE TO RELATED APPLICATION

The present application is a continuation of International Application No. PCT/CN2023/074850, filed on Feb. 7, 2023, which claims priority to Chinese Patent Application No. 202211680023.2, filed with China National Intellectual Property Administration on Dec. 27, 2022 and entitled "capacitive isolator, semiconductor device", both of which are hereby incorporated by reference in their entireties.

FIELD OF INVENTION

This application generally relates to semiconductor fields. Specifically, this application relates to galvanic isolator. More specifically, this application relates to a capacitive isolator.

BACKGROUND OF THE INVENTION

Digital isolators have been widely used in industrial control fields to effect communication of digital signal, isolation of ground noise, and protection to electronic devices. Conventionally, digital isolators may include magnetic isolators and capacitive isolators. Generally, a capacitive isolator may include a high voltage capacitor with an upper electrode plate and a lower electrode plate electrically coupled to two circuits that must be isolated. Displacement current could flow between the two circuits through the capacitive isolator to implement transmission of signals, while the insulating materials between the electrode plates provide isolation for low frequency voltage signals.

In modern semiconductor circuits, multiple capacitive isolators have be used. A parasite resistance-capacitor network exists between isolator capacitors that may form electrical couplings between capacitive isolators. Such parasite resistance-capacitor networks may significantly impact the performance of the semiconductor circuits. For example, when two capacitive isolators are connected to signals with opposite polarity, the parasite resistance-capacitor network may reduce the transmission capacity of signals when one signal is transmitted by a rising edge while the other signal is transmitted by a falling edge. Conventionally, this problem could be mitigated by increasing the distance between the electrode plates of the capacitive isolators. However, it may significantly increase the footprint of the semiconductor die, hence increasing the cost of the product. There is a great need in the industry to increase the breakdown voltage of the capacitive isolator and to reduce the interference between signals.

BRIEF SUMMARY OF THE INVENTION

In one aspect of the present invention, an capacitive isolator is developed. According to some embodiments, the capacitive isolator includes a substrate; a shallow trench isolation region coupled to the substrate; a polysilicon layer disposed above the shallow trench isolation region; a bottom metal plate disposed above the polysilicon layer; one or more lower dielectric layers above the bottom metal plate; an intermediate metal plate disposed above the one or more lower dielectric layers; and a top metal plate disposed above the intermediate metal plate.

According to some embodiments of the present invention, the capacitive isolator may further include According to some embodiments of the present invention, the capacitive isolator may further include a field oxide layer disposed above the substrate, wherein the bottom metal plate is disposed above the field oxide layer.

According to some embodiments of the present invention, the top metal plate has a width less than that of the bottom metal plate.

According to some embodiments of the present invention, the intermediate metal plate has a width equal to or less than that of the bottom metal plate.

According to some embodiments of the present invention, the intermediate metal plate has a width less than that of the bottom metal plate and greater than that of the top metal plate.

According to some embodiments of the present invention, the capacitive isolator may further include a bottom dielectric layer disposed on the bottom metal plate.

According to some embodiments of the present invention, the capacitive isolator may further include an intermediate dielectric layer disposed on the intermediate metal plate.

According to some embodiments of the present invention, the capacitive isolator may further include a passivation layer disposed on the top metal plate.

In another aspect of the present invention, a semiconductor device is developed. According to some embodiments of the present invention, the semiconductor device may include a substrate, wherein the substrate include a first shallow trench isolation region and a second shallow trench isolation region; a polysilicon layer disposed above the substrate; a bottom metal layer disposed on the polysilicon layer, wherein the bottom metal layer comprises a first bottom metal plate located above the first shallow trench isolation region, and a second bottom metal plate located above the second shallow trench isolation region; one or more lower dielectric layers disposed above the bottom metal layer; an intermediate metal layer disposed on the one or more lower dielectric layers, wherein the intermediate metal layer comprises a first intermediate metal plate located above the first bottom metal plate and a second intermediate metal plate located above the second bottom metal plate; a top metal layer disposed above the intermediate metal layer, wherein the top metal layer comprises a first top metal plate located above the first intermediate metal plate and a second top metal plate located above the second intermediate metal plate; and an isolation structure comprising: a central n-type well formed in the substrate and between the first shallow trench isolation region and the second shallow trench isolation region; a central n-type pickup formed within the central n-type well; and p-type pickups formed at either side of the central n-type well.

According to some embodiments of the present invention, the semiconductor device may further include one or more upper dielectric layers disposed above the intermediate metal layer.

According to some embodiments of the present invention, the semiconductor device may further include a field oxide layer disposed above the substrate, wherein the bottom metal layer is disposed above the field oxide layer.

According to some embodiments of the present invention, the first top metal plate has a width less than that of the first bottom metal plate.

According to some embodiments of the present invention, the first intermediate metal plate has a width equal to or less than that of the first bottom metal plate.

According to some embodiments of the present invention, the first intermediate metal plate has a width less than that of the first bottom metal plate and greater than that of the first top metal plate.

According to some embodiments of the present invention, the semiconductor device may further include a bottom dielectric layer disposed on the bottom metal layer.

According to some embodiments of the present invention, the semiconductor device may further include an intermediate dielectric layer disposed on the intermediate metal layer.

According to some embodiments of the present invention, the semiconductor device may further include a passivation layer disposed on the top metal layer.

According to some embodiments of the present invention, the isolation structure further comprises a first metal contact and a second metal contact formed in the bottom metal layer between the first bottom metal plate and the second bottom metal plate, wherein the p-type pickups are electrically coupled with the first metal contact and the central n-type pickup is electrically coupled with the second metal contact.

In another aspect of the present invention, a method for fabricating an capacitive isolator is developed. According to some embodiments of the present invention, the method may include: providing a substrate; forming a shallow trench isolation layer coupled to the substrate; forming a polysilicon layer above the shallow trench isolation layer; forming a bottom metal plate above the polysilicon layer; forming one or more lower dielectric layers above the bottom metal plate; forming an intermediate metal plate above the one or more lower dielectric layers; and forming a top metal plate over the intermediate metal plate.

According to some embodiments of the present invention, the method may further include forming one or more upper dielectric layers above the intermediate metal plate.

According to some embodiments of the present invention, the method may further include forming a field oxide layer above the substrate, wherein the bottom metal plate is disposed above the field oxide layer.

According to some embodiments of the present invention, the method may further include forming an intermediate dielectric layer on the intermediate metal plate.

According to some embodiments of the present invention, the method may further include forming a passivation layer on the top metal plate.

In another aspect of the present invention, a method for fabricating a semiconductor device is developed. According to some embodiments of the present invention, the method may include: providing a substrate; forming a central n-type well in the substrate, then forming a central n-type pickup within the central n-type well, then forming p-type pickups at either side of the central n-type well; forming a shallow trench isolation layer in the substrate, wherein the shallow trench isolation layer comprises a first shallow trench isolation region and a second shallow trench isolation region, wherein the central n-type pickup and the p-type pickups are disposed between the first shallow trench isolation region and the second shallow trench isolation region; forming a polysilicon layer above the substrate; forming a bottom metal layer above the polysilicon layer, wherein the bottom metal layer comprises a first bottom metal plate located above the first shallow trench isolation region, and a second bottom metal plate located above the second shallow trench isolation region; forming one or more lower dielectric layers above the bottom metal layer; forming an intermediate metal layer on the one or more lower dielectric layers, wherein the intermediate metal layer comprises a first intermediate metal plate located above the first bottom metal plate and a second intermediate metal plate located above the second bottom metal plate; and forming a top metal layer above the intermediate metal layer, wherein the top metal layer comprises a first top metal plate located above the first intermediate metal plate and a second top metal plate located above the second intermediate metal plate.

According to some embodiments of the present invention, the method may further include forming one or more upper dielectric layers above the intermediate metal layer.

According to some embodiments of the present invention, the method may further include forming a field oxide layer on the substrate, wherein the bottom metal layer is disposed above the field oxide layer.

According to some embodiments of the present invention, the method may further include forming a bottom dielectric layer on the bottom metal layer.

According to some embodiments of the present invention, the method may further include forming an intermediate dielectric layer on the intermediate metal layer.

According to some embodiments of the present invention, the method may further include forming a passivation layer on the top metal layer.

In another aspect of the present invention, an capacitive isolator is developed. According to some embodiments, the capacitive isolator includes a substrate; an isolation n-type well coupled to the substrate; a polysilicon layer disposed above the isolation n-type well; a bottom metal plate disposed above the polysilicon layer; one or more lower dielectric layers above the bottom metal plate; an intermediate metal plate disposed above the one or more lower dielectric layers; and a top metal plate disposed above the intermediate metal plate.

In another aspect of the present invention, a semiconductor device is developed. According to some embodiments, the semiconductor device includes a substrate, wherein the substrate comprises a first isolation n-type well and a second isolation n-type well; a polysilicon layer disposed above the substrate; a bottom metal layer disposed on the polysilicon layer, wherein the bottom metal layer comprises a first bottom metal plate located above the first isolation n-type well, and a second bottom metal plate located above the second isolation n-type well; one or more lower dielectric layers disposed above the bottom metal layer; an intermediate metal layer disposed on the one or more lower dielectric layers, wherein the intermediate metal layer comprises a first intermediate metal plate located above the first bottom metal plate and a second intermediate metal plate located above the second bottom metal plate; a top metal layer disposed above the intermediate metal layer, wherein the top metal layer comprises a first top metal plate located above the first intermediate metal plate and a second top metal plate located above the second intermediate metal plate; and an isolation structure comprising: a central n-type well formed in the substrate and between the first isolation n-type well and the second isolation n-type well; a central n-type pickup formed within the central n-type well; and p-type pickups formed at either side of the central n-type well.

In another aspect of the present invention, a method for fabricating an capacitive isolator is developed. According to some embodiments, the method includes providing a substrate; forming an isolation n-type well coupled to the substrate; forming a polysilicon layer above the isolation n-type well; forming a bottom metal plate above the polysilicon layer; forming one or more lower dielectric layers above the bottom metal plate; forming an intermediate metal plate above the one or more lower dielectric layers; and forming a top metal plate over the intermediate metal plate.

In another aspect of the present invention, a method for fabricating semiconductor device is developed. According to some embodiments, the method includes providing a substrate; forming a central n-type well, a first isolation n-type well, and a second isolation n-type well in the substrate, wherein the central n-type well is disposed between the first isolation n-type well and the second isolation n-type well; forming a central n-type pickup within the central n-type well, forming a first isolation pickup within the first isolation n-type well, and forming a second isolation pickup within he second isolation n-type well, then forming p-type pickups at either side of the central n-type well, wherein the central n-type pickup and the p-type pickups are disposed between the first isolation n-type well and the second isolation n-type well; forming a polysilicon layer above the substrate; forming a bottom metal layer above the polysilicon layer, wherein the bottom metal layer comprises a first bottom metal plate located above the first shallow trench isolation region, and a second bottom metal plate located above the second shallow trench isolation region; forming one or more lower dielectric layers above the bottom metal layer; forming an intermediate metal layer on the one or more lower dielectric layers, wherein the intermediate metal layer comprises a first intermediate metal plate located above the first bottom metal plate and a second intermediate metal plate located above the second bottom metal plate; and forming a top metal layer above the intermediate metal layer, wherein the top metal layer comprises a first top metal plate located above the first intermediate metal plate and a second top metal plate located above the second intermediate metal plate.

Numerous benefits can be achieved by way of the present invention over conventional techniques. For example, embodiments of the present invention provide an capacitive isolator, which can improve the breakdown voltage of the capacitive isolator by adding an intermediate metal plate between the bottom metal plate and the top metal plate. At the same time, the capacitive isolator can remain low profile. For example, the breakdown voltage of the capacitive isolator can increase by 10%-20% compared with a conventional capacitive isolator without the intermediate metal plate. As another example, embodiments of the present invention provide a semiconductor device including two capacitive isolators and an isolation structure disposed between the two capacitive isolators, which can reduce signal interference between signals transmitting through the two capacitive isolators. These and other embodiments of the invention along with many of its advantages and features are described in more detail in conjunction with the text below and attached figures.

DETAILED DESCRIPTION OF THE INVENTION

Figure 1A:
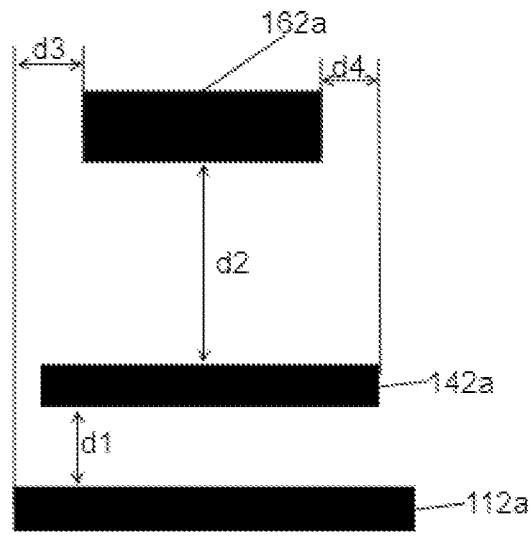
FIG. 1A is a simplified diagram to show the structures of the lower metal plate, the intermediate metal plate, and the upper metal plate of an capacitive isolator according to some embodiments of the present invention.

Reference will now be made in detail to various embodiments, examples of which are illustrated in the accompanying drawings. In this regard, the present embodiments may have different forms and should not be construed as being limited to the descriptions set forth herein. Accordingly, the embodiments are merely described below, by referring to the figures, to explain aspects of the present description. In the drawings, like reference numerals denote like elements. In the drawing The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the specification, it will be understood that when an element is referred to as being 'on' another element, it can be directly on the other element, or intervening elements may also be present. Like reference numerals refer to like elements throughout.

Additionally, the embodiments in the detailed description will be described with sectional views as ideal exemplary views. In the figures, the dimensions of layers and regions are exaggerated for clarity of illustration. Accordingly, shapes of the exemplary views may be modified according to manufacturing techniques and/or allowable errors. Therefore, the embodiments disclosed herein are not limited to the specific shape illustrated in the exemplary views, but may include other shapes that may be created according to manufacturing processes.

Also, though terms like a first, a second, and a third are used to describe various elements, regions, and layers in various embodiments, the elements, regions, and the layers are not limited to these terms. Unless indicated as otherwise, these terms are used only to discriminate one element, region, or layer from another element, region, or layer.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, location, shapes, sizes, amounts, or other measures do not necessarily mean an exactly identical orientation, location, shape, size, amount, or other measure, but are intended to encompass nearly identical orientation, location, shapes, sizes, amounts, or other measures within acceptable variations that may occur, for example, due to manufacturing processes.

The term "horizontal" as used herein is defined as a plane substantially parallel to the conventional plane or surface of the substrate of the invention, regardless of its actual orientation in space. The term "vertical refers to a direction substantially perpendicular to the horizontal as defined above. Terms such as "on," "above," "below," "bottom," "top," "side," "sidewall," "higher," "lower," "upper," "over," and "under" are defined in respect of the horizontal plane discussed above.

Unless otherwise defined, all terms, including technical and scientific terms, used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3A:
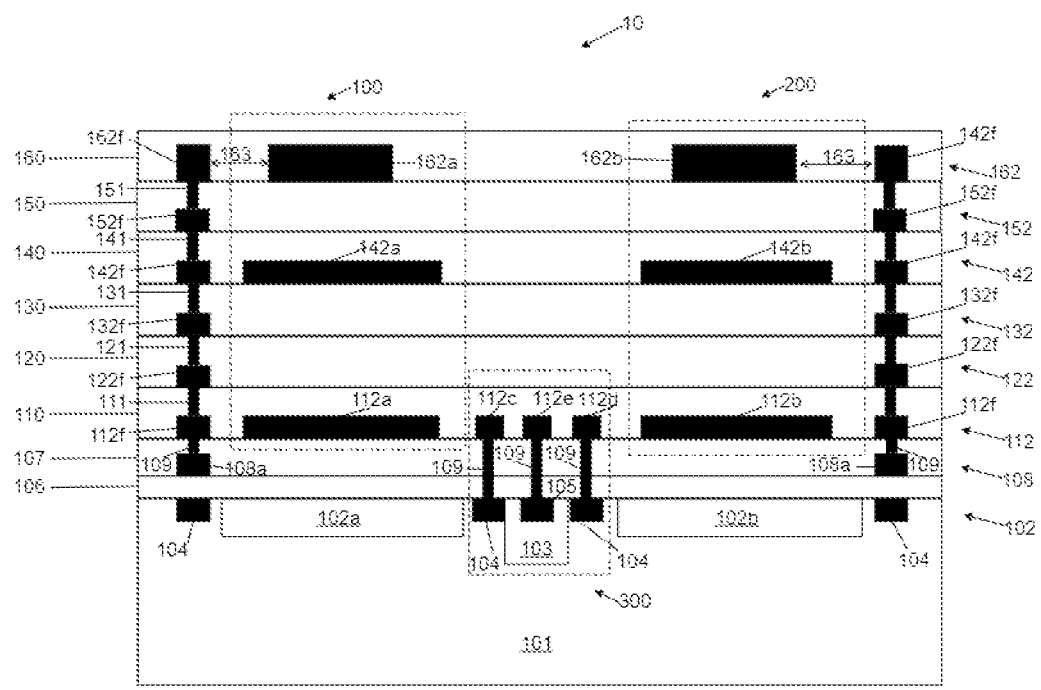
FIG. 3A is a cross-section of a semiconductor device according to some embodiments of the present invention.

FIG. 3A is a cross-section of a semiconductor device 10 according to some embodiments of the present invention. As shown in FIG. 3A, semiconductor device 10 may include first and second capacitive isolators 100 and 200 formed above a substrate 101. It should be noted that semiconductor device 10 may include more capacitive isolators, as discussed herein, and that first and second capacitive isolators 100 and 200 are shown for the purpose of illustrating the present invention. They should not be understood in any sense as limiting the protection scope of the present invention. In some embodiments, substrate 101 may be a silicon-based semiconductor, such as a silicon wafer. In one embodiment, substrate 101 may include p-type silicon wafer. In some embodiments, semiconductor device 10 may include an isolation structure 300.

In some embodiments, semiconductor device 10 may include a shallow trench isolation layer 102 formed in substrate 101. As used herein, the term "layer" may refer to a sheet, quantity, or thickness of material. The term "layer" may also refer to a portion of a substrate with different characteristic than the remainder of the substrate. For example, a portion of a substrate may be highly doped to form an active region, which may be referred to as a "layer." Similarly, a portion of a substrate may be doped to form a well, which may be designated as a "layer". The active region layer and the well layer may not be visibly identifiable or visibly differentiable from the substrate. However, the existence of the layer may be detected through electrical behavior. As shown in FIG. 3A, in some embodiments, shallow trench isolation layer 102 may include a first shallow trench isolation region 102a and a second shallow trench isolation region 102b horizontally separated from each other. In some embodiments, as a part of isolation structure 300, a central n-type well 103 is disposed in substrate 101 between first shallow trench isolation region 102a and second shallow trench isolation region 102b, and a central n-type pickup 105 is disposed within central n-type well 103. In some embodiments, central n-type well 103 may have a greater thickness than that of central n-type pickup 105. In some embodiments, central n-type well 103 and central n-type pickup 105 may be formed using ion implantation process. For example, the dopant used in the ion implantation process may include phosphorous, arsenic, antimony, or bismuth. The dopant concentration used in the ion implantation process my include from about $1\times10^{14}$ $cm^{-3}$ to about $1\times10^{19}$ $cm^{-3}$. In some embodiments, the thickness of central n-type well 103 ranges from about 0.5 μm to about 4 μm, and the thickness of central n-type pickup 105 ranges from about 50 nm to about 100 nm. In some embodiments, central n-type well 103 may have a lower dopant concentration than that of central n-type pickup 105. In some embodiments, central n-type well 103 may be electrically coupled to a high voltage through central n-type pickup 105 to reduce the signal interference between signals coupled to first and second capacitive isolators 100 and 200.

As shown in FIG. 3A, semiconductor device 10 may include a p-type pickup 104 formed in substrate 101 around shallow trench isolation layer 102. In some embodiments, p-type pickup 104 may be formed at either side of shallow trench isolation layer 102. Thus, p-type pickup 104 is placed at either side of central n-type well 103. In some embodiments, p-type pickup 104 may be formed as a protective ring surrounding shallow trench isolation layer 102. As discussed above, p-type pickup 104 may be formed using an ion implantation process like central n-type well 103. For example, the dopant used in the ion implantation process for p-type pickup 104 may include boron, aluminum, gallium, or indium. The dopant concentration used in the ion implantation process for p-type pickup 104 may include from about $1\times10^{14}$ $cm^{-3}$ to about $1\times10^{19}$ $cm^{-3}$. In some embodiments, the thickness of p-type pickup 104 ranges from about 50 nm to about 100 nm.

In some embodiments, semiconductor device 10 may include a field oxide layer 106 formed on substrate 101 to provide isolation for elements of semiconductor device 10. In some embodiments, field oxide layer 106 may include silicon oxide. For example, field oxide layer 106 may include a thickness of about 500 nm to about 1000 nm. In some embodiments, field oxide layer 106 may be formed using a plasma enhanced chemical vapor deposition (PECVD) process.

As shown in FIG. 3A, semiconductor device 10 may include a polysilicon layer 108 on field oxide layer 106. In some embodiments, polysilicon layer 108 may include a plurality of polysilicon contacts 108a to provide interconnection for circuits of semiconductor device 10. A first dielectric layer 107 is disposed between and on the plurality of polysilicon contacts 108a. In some embodiments, first dielectric layer 107 may be formed on field oxide layer 106. For example, first dielectric layer 107 may include silicon oxide-based dielectric materials.

In some embodiments, a bottom metal layer 112 is disposed on first dielectric layer 107. As shown in FIG. 3A, bottom metal layer 112 disposed above polysilicon layer 108. As shown in FIG. 3A, bottom metal layer 112 may include a first bottom metal plate 112a, a second bottom metal plate 112b, and a plurality of metal contacts 112c, 112d, 112e, and 112f. In some embodiments, first bottom metal plate 112a is configured to be the lower electrode plate for first capacitive isolator 100 and located above first shallow trench isolation region 102a, and second bottom metal plate 112b is configured to be the lower electrode plate for second capacitive isolator 200 and located above second shallow trench isolation region 102b. In some embodiments, first bottom metal plate 112a, second bottom metal plate 112b, and metal contacts 112c-112f may be fabricated from the same metallic materials, such as, aluminum or copper. A bottom dielectric layer 110 is disposed on bottom metal layer 112 and between first bottom metal plate 112a, metal contacts 112c-112f, and second bottom metal plate 112b.

In some embodiments, metal vias 109 are disposed in first dielectric layer 107 to provide interconnections between bottom metal layer 112 and underlying polysilicon layer 108. In some embodiments, metal vias 109 may be further disposed through first dielectric layer 107 and field oxide layer 106 to provide electrical interconnections between bottom metal layer 112 and underlying substrate 101. As shown in FIG. 3A, a metal via 109 may extend partially into first dielectric layer 107 to electrically couple metal contact 112f and polysilicon contact 108a. Some metal vias 109 may extend through first dielectric layer 107 and field oxide layer 106 to electrically couple metal contact 112c and p-type pickup 104, to electrically couple metal contact 112e and central n-type pickup 105.

In some embodiments, semiconductor device 10 may further include one or more lower metal layers and correspondingly one or more lower dielectric layers over bottom dielectric layer 110. For example, semiconductor device 10 may include a lower metal layer 122 and corresponding lower dielectric layer 120 disposed on bottom dielectric layer 110. For example, semiconductor device 10 may further include a lower metal layer 132 and corresponding lower dielectric layer 130 disposed on lower dielectric layer 120. It should be noted the number of lower metal layers and corresponding lower dielectric layers are not limited to two as shown in FIG. 3A. A person ordinary skill in the art would understand that the number of lower metal layers and corresponding lower dielectric layers are determined as desired by particular applications.

As shown in FIG. 3A, each lower metal layer 122 and 132 may include metal contacts 122f and 132f like those metal contacts 112f in bottom metal layer 112 to provide interconnections between adjacent metal layers. Each lower dielectric layer may include metal vias to provide interconnections between adjacent layers. For example, as shown in FIG. 3A, bottom dielectric layer 110 may include metal vias 111 to provide interconnections between metal contacts 112f in bottom metal layer 112 and metal contacts 122f in lower metal layer 122. Similarly, lower dielectric layer 120 may include metal vias 121 to provide interconnections between metal contact 122f in lower metal layer 122 and metal contact 132f in lower metal layer 132. Similarly, lower dielectric layer 130 may include metal vias 131 to provide interconnections between metal contact 132f in lower metal layer 132 and metal contact 142f in the above intermediate metal layer 142.

In some embodiments, semiconductor device 10 may include an intermediate metal layer 142 disposed on the one or more lower dielectric layers. As shown in FIG. 3A, intermediate metal layer 142 may include a first intermediate metal plate 142a, a second intermediate metal plate 142b, and a plurality of metal contact 142f. In some embodiments, first intermediate metal plate 142a is configured to be an intermediate electrode plate for first capacitive isolator 100 and located above first bottom metal plate 112a, and second intermediate metal plate 142b is configured to be an intermediate electrode plate for second capacitive isolator 200 and located above second bottom metal plate 112b. An intermediate dielectric layer 140 is disposed on intermediate metal layer 142 and between metal contacts 142f, first intermediate metal plate 142a, and second intermediate metal plate 142b. In some embodiments, intermediate dielectric layer 140 may include metal vias 141 to interconnect the elements in adjacent layers.

In some embodiments, one or more upper metal layers and corresponding upper dielectric layers may be disposed on the intermediate dielectric layer 140. For example, semiconductor device 10 may include an upper metal layer 152 disposed on intermediate dielectric layer 140. In some embodiments, upper metal layer 152 may include metal contacts 152f for interconnect elements in adjacent layers. For example, metal contact 152f is electrically coupled to metal via 141 disposed in intermediate dielectric layer 140. Upper dielectric layer 150 is disposed on upper metal layer 152 between metal contacts 152f. It should be understood by those of ordinary skills in the art that upper metal layer 152 and upper dielectric layer 150 are shown for illustrating some embodiments of the present invention. It should not be understood as that the present invention is limited to include only one upper metal layer and one upper dielectric layer. The number and thickness of upper metal layers and corresponding upper dielectric layers could be determined as desired by particular applications. For clarity of description, the below description takes one upper metal layer and one upper dielectric layer for an exemplary illustration.

As shown in FIG. 3A, semiconductor device 10 may further include a top metal layer 162 disposed on the one or more upper dielectric layers. For example, top metal layer 162 is disposed on upper dielectric layer 150. Top metal layer 162 may include first top metal plate 162a, second top metal plate 162b, and metal contacts 162f. In some embodiments, first top metal plate 162a is configured to be the upper electrode plate for first capacitive isolator 100 and located above first intermediate metal plate 142a, and second top metal plate 162b is configured to be the upper electrode plate for second capacitive isolator 200 and located above second intermediate metal plate 142b. Metal contacts 162f are configured to provide interconnections for elements in adjacent layers. For example, metal contact 162f is electrically coupled to metal via 151 in upper dielectric layer 150. In some embodiments, first top metal plate 162a, second top metal plate 162b, and metal contacts 162f may be fabricated from the same metallic materials, such as aluminum or copper, in one manufacturing process. A top dielectric layer 160 is disposed on top metal layer 162 and between first top metal plate 162a, second top metal plate 162b, and metal contacts 162f. As used herein, top dielectric layer 160 may also be referred to as passivation layer.

As shown in FIG. 3A, in some embodiments, each of first top metal plate 162a and second top metal plate 162b is separated from a respective metal contact 162f by a distance 163. Usually, an internal circuit of semiconductor device 10 connected to metal contact 162f should be separated from the first or second capacitive isolator 100 or 200 for a predetermined distance to satisfy the breakdown voltage requirement. The greater the breakdown voltage is required, the greater the distance 163 is selected. For example, when first capacitive isolator 100 is adopted in a circuit that requires the breakdown voltage to be greater than 10 kV, distance 163 should be determined to be greater than 80 μm.

In some embodiments, semiconductor device 10 may further include one or more layers over top dielectric layer 160. For example, a protective layer could be disposed on top dielectric layer 160 to provide additional protection from humidity, dirt, and debris from interfering with the internal circuits of semiconductor device 10. The protective layer may be fabricated from insulating materials, such as polyimide, silicon nitride, silicon oxide nitride, and/or silicon dioxide.

Figure 3B:
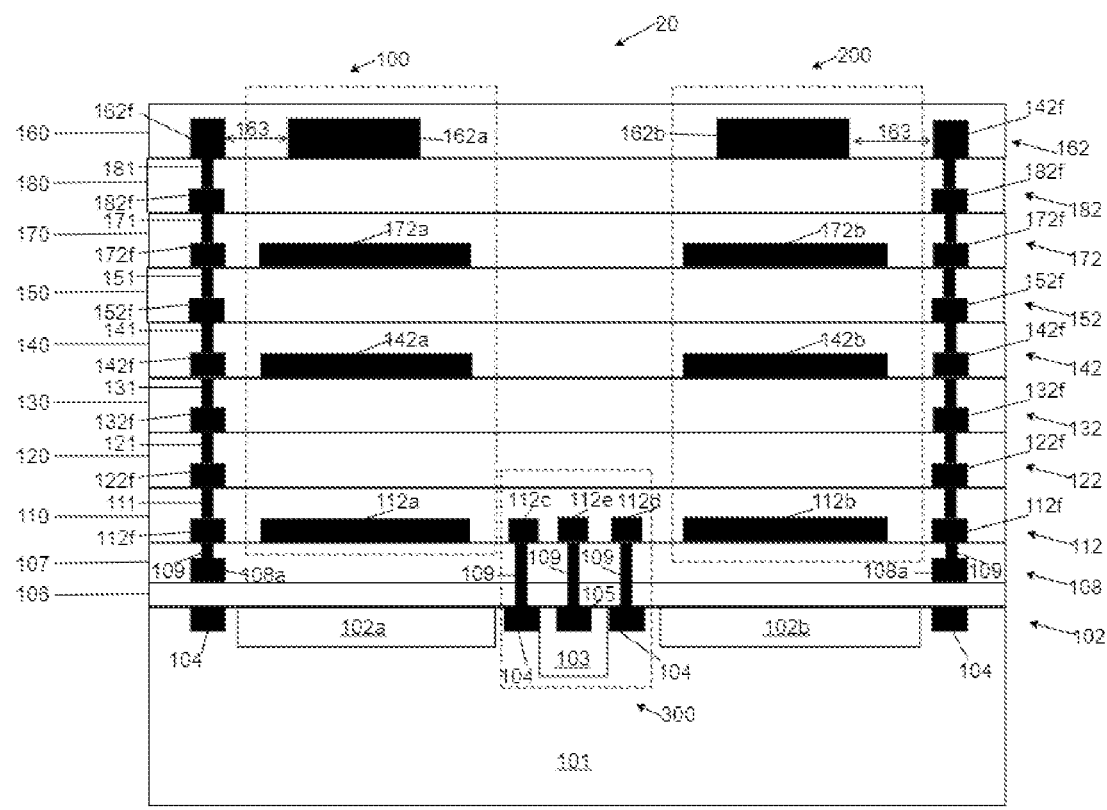
FIG. 3B is a cross-section of another semiconductor device according to some embodiments of the present invention.

FIG. 3B is a cross-section of a semiconductor device 20 according to some embodiments of the present invention. The difference between semiconductor device 20 shown in FIG. 3B and semiconductor device 10 shown in FIG. 3A lies in that semiconductor device 20 include second intermediate metal layer 172 disposed on second intermediate dielectric layer 170. As shown in FIG. 3B, second intermediate metal layer 172 may include a third intermediate metal plate 172a, a fourth intermediate metal plate 172b, and a plurality of metal contact 172f. In some embodiments, third intermediate metal plate 172a is configured to be an intermediate electrode plate for first capacitive isolator 100 and located above first bottom metal plate 112a, and fourth intermediate metal plate 172b is configured to be an intermediate electrode plate for second capacitive isolator 200 and located above second bottom metal plate 112b. Second intermediate dielectric layer 170 is disposed on second intermediate metal layer 172 and between metal contacts 172f, third intermediate metal plate 142a, and fourth intermediate metal plate 172b. In some embodiments, second intermediate dielectric layer 170 may include metal vias 171 to interconnect the elements in adjacent layers. It should be noted that the present invention is not limited to intermediate metal layer 142 and second intermediate metal layer 172 as shown in FIG. 3B. In some other embodiments not shown, a semiconductor device may include more intermediate metal layers with similar structure as that of intermediate metal layer 142.

As shown in FIG. 3B, semiconductor device 20 may further include additional upper metal layer 182 disposed on second intermediate dielectric layer 170. In some embodiments, upper metal layer 182 may include metal contacts 182f for interconnect elements in adjacent layers. For example, metal contact 182f is electrically coupled to metal via 171 disposed in second intermediate dielectric layer 170. Upper dielectric layer 180 is disposed on upper metal layer 182 between metal contacts 182f. It should be understood by those of ordinary skills in the art that upper metal layer 182 and upper dielectric layer 180 are shown for illustrating some embodiments of the present invention. It should not be understood as that the present invention is limited to include only one such upper metal layer 182 and one upper dielectric layer 180. The number and thickness of upper metal layers and corresponding upper dielectric layers could be determined as desired by particular applications. For clarity of description, the below description takes one upper metal layer and one upper dielectric layer for an exemplary illustration.

As shown in FIG. 3B, semiconductor device 20 may further include top metal layer 162 disposed on upper dielectric layer 180, and top dielectric layer 160 disposed on top metal layer 162 and between first top metal plate 162a, second top metal plate 162b, and metal contacts 162f. The details of the structures of top metal layer 162 and top dielectric layer 160 is omitted to avoid duplication.

FIG. 1A is a simplified diagram to show the structures of the lower metal plate, the intermediate metal plate, and the upper metal plate of a capacitive isolator according to some embodiments of the present invention. For clarity of illustration, other elements of semiconductor device 10 is omitted. In FIG. 1A, the structure of the capacitive isolator is illustrated by way of first capacitive isolator 100. It should be noted that the structure illustrated in FIG. 1A is equally applies to second capacitive isolator 200. As shown in FIG. 1A, first bottom metal plate 112a is separated from first intermediate metal plate 142a by a first distance d1, while first intermediate metal plate 142a is separated from first top metal plate 162a by a second distance d2. In some embodiments, first distance d1 may be determined based on the number of upper dielectric layers and the thickness of each upper dielectric layers. Similarly, second distance d2 may be determined based on the number of lower dielectric layers and the thickness of each lower dielectric layers.

As shown in FIG. 1A, in some embodiments, the width of first top metal plate 162a along the horizontal direction is less than that of first bottom metal plate 112a by a third distance d3. It should be noted that the third distance d3 is measured from the same side of each of first bottom metal plate 112a and first top metal plate 162a when first bottom metal plate 112a and first top metal plate 162a is centered with respect to each other in the vertical direction. This design may reduce the intensity of the electric field around first top metal plate 162a, hence facilitating to increase the breakdown voltage of first capacitive isolator 100. In some embodiments, the width of first intermediate metal plate 142a measured along the horizontal direction could be the same as that of first bottom metal plate 112a. In some embodiments, the width of first intermediate metal plate 142a measured along the horizontal direction could be the same as that of first top metal plate 162a. In some other embodiments, the width of first top metal plate 162a measured along the horizontal direction could be less than that of first intermediate metal plate 142a by a fourth distance d4. It should be noted that the fourth distance d4 is measured from the same side of each of first top metal plate 162a and first intermediate metal plate 142a when first top metal plate 162a and first intermediate metal plate 142a is centered with respect to each other in the vertical direction. In some embodiments, first intermediate metal plate 142a may have a width less than that of first bottom metal plate 112a and greater than that of first top metal plate 162a. That is, third distance d3 is equal to or greater than fourth distance d4, and fourth distance d4 is equal to or greater than zero. This design may further reduce the intensity of the horizontal electric field around first top metal plate 162a and facilitate to further improve the breakdown voltage of first capacitive isolator 100. Experiments conducted by the inventors show that the breakdown voltage in the capacitive isolator according to some embodiments of the present invention has been increased by 10-20% compared with conventional capacitive isolator without the intermediate metal layer.

Figure 1B:
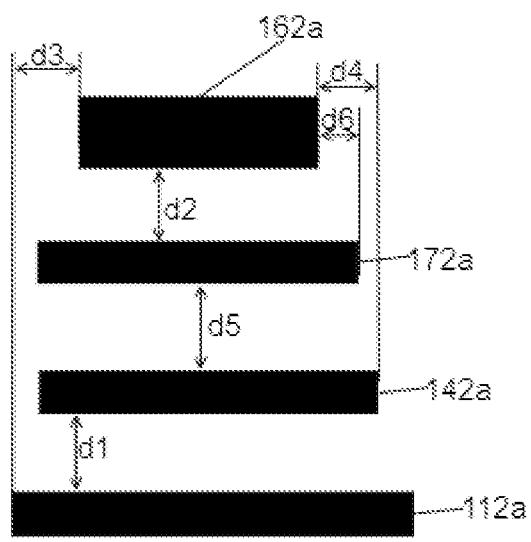
FIG. 1B is a simplified diagram to show the structures of the lower metal plate, the intermediate metal plates, and the upper metal plate of a capacitive isolator according to some embodiments of the present invention.

FIG. 1B is a simplified diagram to show the structures of the lower metal plate, the intermediate metal plate, and the upper metal plate of a capacitive isolator according to some embodiments of the present invention. For clarity of illustration, other elements of semiconductor device 20 is omitted. In FIG. 1B, the structure of the capacitive isolator is illustrated by way of first capacitive isolator 100. It should be noted that the structure illustrated in FIG. 1B is equally applies to second capacitive isolator 200. As shown in FIG. 1B, first bottom metal plate 112a is separated from first intermediate metal plate 142a by a first distance d1, first intermediate metal plate 142a is separated from third intermediate metal plate 172a by a fifth distance d5, while third intermediate metal plate 172a is separated from first top metal plate 162a by second distance d2. In some embodiments, the width of first top metal plate 162a measured along the horizontal direction could be less than that of third intermediate metal plate 172a by a sixth distance d6. In some embodiments, fourth distance d4 may be different from sixth distance d6. In some other embodiments, fourth distance d4 may be the same as sixth distance d6. Other elements and distances shown in FIG. 1B are similar to that shown in FIG. 1A.

Figure 2A:
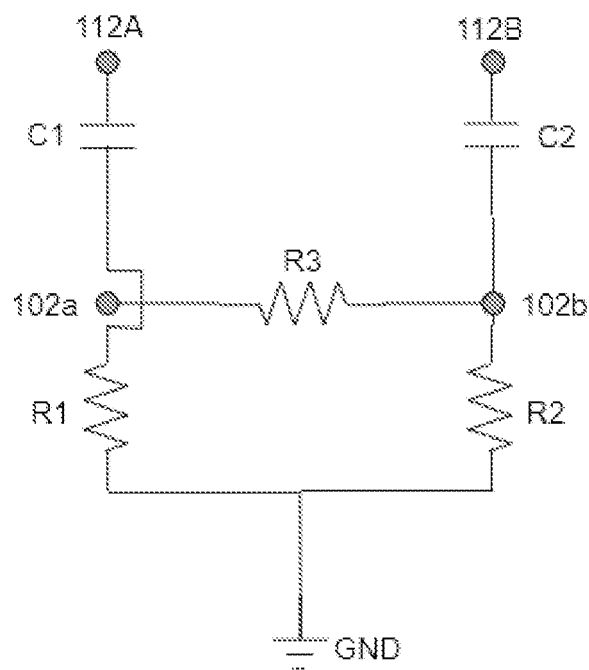
FIG. 2A-2B are simplified circuit diagrams showing the parasite resistances and parasite capacitances under the lower metal plate of the capacitive isolator according to some embodiments of the present invention.

FIG. 2A is a simplified circuit diagram showing the parasite resistances and parasite capacitances under the lower metal plate of the capacitive isolator according to some embodiments of the present invention. Generally, if two capacitive isolators are positioned adjacent to each other, two signals coupled to the two capacitive isolators will interfere with each other because a parasite resistance is formed between the lower metal plate of each capacitive isolator and the underlying substrate and the resistance of the substrate could not be reduced to zero. FIG. 2A shows the equivalent circuit of the area between the lower metal plate of the capacitive isolator and the substrate. As used herein, the shallow trench isolation layer 102 represents the substrate. As shown in FIG. 2A, capacitor C1 represents the parasite capacitance between first bottom metal plate 112a of first capacitive isolator 100 and the first shallow trench isolation region 102a, and capacitor C2 represents the parasite capacitance between second bottom metal plate 112b of second capacitive isolator 200 and second shallow trench isolation region 102b. Resistance R1 represents the resistance between the first shallow trench isolation region 102a and outside circuit ground GND, while resistance R2 represents the resistance between the second shallow trench isolation region 102b and outside circuit ground GND. Resistance R3 represents the resistance between first shallow trench isolation region 102a and second shallow trench isolation region 102b. As shown in FIG. 2A, resistances R1 and R2 become greater and resistance R3 becomes less as capacitors C1 and C2 become greater. Accordingly, the interference between the signals coupled to first and second capacitive isolators 100 and 200 becomes worse. Referring back to FIG. 3A, the inventors of the present invention invented the isolation structure 300 to reduce the interference. In some embodiments, isolation structure 300 may include central n-type pickup 105 disposed in central n-type well 103 and p-type pickup 104 positioned at either side of central n-type well 103. In operation, central n-type well 103 is electrically coupled to a high level through central n-type pickup 105, while p-type pickup 104 is electrically coupled to a ground terminal of semiconductor device 10. Based on the design according to some embodiments of the present invention, isolation structure 300 could suppress the flow of carriers in the substrate 101. The electrical behavior of the isolation structure 300 is equivalent to reduce resistances R1 and R2 and increase resistance R3. It could significantly suppress the interference between signals coupled to first and second capacitive isolators 100 and 200.

In another aspect of the present invention, a method for fabricating semiconductor device 10 is developed. FIGS. 4-12 are cross-sections showing successive stages of the method for fabricating semiconductor device 10 according to some embodiments of the present invention.

Figure 4:
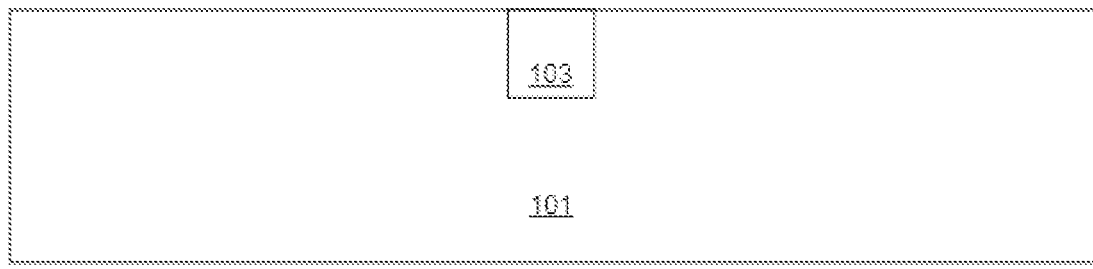
FIGS. 4-12 are cross-sections showing successive stages of the method for fabricating semiconductor device according to some embodiments of the present invention.

As shown in FIG. 4, in some embodiments, the method may include providing a substrate 101 and forming central n-type well 103 in substrate 101. Specifically, central n-type well 103 is formed using an ion implantation process with phosphorus ions or arsenic ions having a dopant concentration of from about $1\times10^{15}$ cm$^{-3}$ to about $1\times10^{18}$ cm$^{-3}$.

Figure 5:
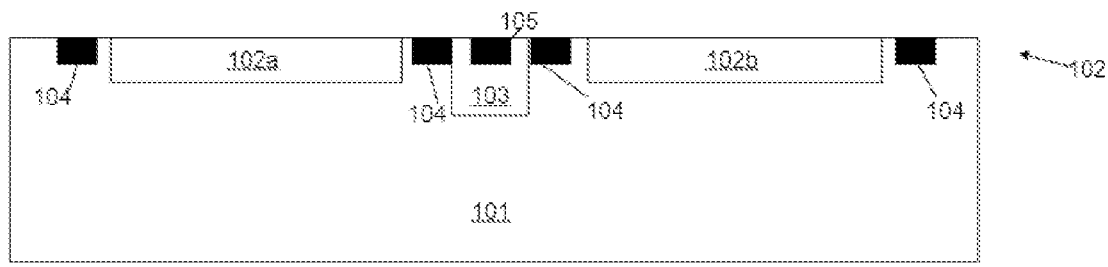

As shown in FIG. 5, in some embodiments, the method may then include forming p-type pickup 104 and central n-type pickup 105 in substrate 101. Specifically, p-type pickup 104 is formed using an ion implantation process with boron ions or aluminum ions having a dopant concentration of from about $1\times10^{14}$ cm$^{-3}$ to about $1\times10^{17}$ cm$^{-3}$. Then central n-type pickup 105 is formed in central n-type well 103 using an ion implantation process with phosphorus ions or arsenic ions having a dopant concentration of from about $1\times10^{15}$ cm$^{-3}$ to about $1\times10^{18}$ cm$^{-3}$. Next, the method may include forming shallow trench isolation layer 102 using a shallow trench isolation process. Specifically, the shallow trench isolation process may include etching (e.g., dry etching with a hard mask) a pattern of trenches in substrate 101 corresponding to first shallow trench isolation region 102a and second shallow trench isolation region 102b, depositing (e.g. using a PECVD process) oxide-based dielectric materials (e.g., silicon dioxide) within the trenches, then removing the excess dielectric materials using a chemical-mechanical planarization (CMD) process. In some embodiments, central n-type well 103 is formed in substrate 101 between first shallow trench isolation region 102a and second shallow trench isolation region 102b. In some embodiments, p-type pickup 104 is formed adjacent to first shallow trench isolation region 102a and second shallow trench isolation region 102b. In some embodiments, p-type pickup 104 is formed as a protective ring surrounding first shallow trench isolation region 102a and second shallow trench isolation region 102b. In some embodiments, p-type pickup 104 is formed at either side of central n-type well 103. In some embodiments, p-type pickup 104 is formed as a ring surrounding central n-type well 103.

Figure 6:
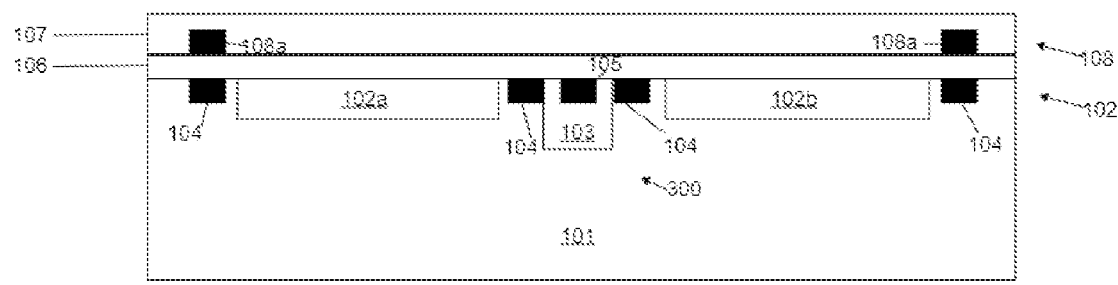

As shown in FIG. 6, the method may further include forming field oxide layer 106 on substrate 101. In some embodiments, field oxide layer 106 may be formed using a PECVD process. For example, field oxide layer 106 may include SiO$_2$. Optionally, the method may include planarizing field oxide layer 106 using a CMD process. In some embodiments, the field oxide layer 106 may include a thickness of from about 300 nm to about 800 nm. Then, the method may further include forming polysilicon layer 108 above substrate 101. Specifically, the method include forming polysilicon layer 108 on field oxide layer 106. In some embodiments, polysilicon layer 108 may be formed using a PECVD process followed by an etch process. For example, a layer of polysilicon material is deposited over field oxide layer 106. Then a patterned etch mask is formed over the layer of polysilicon material to cover areas intended for polysilicon contacts 108a. An etch process, such as plasma etching using chlorine radicals is performed to remove the exposed portion of the layer of polysilicon material by the etch mask, leaving the areas intended for polysilicon contacts 108a. The etch mask is then removed using a plasma etch process. Next, the method may further include depositing first dielectric layer 107 on and between polysilicon contacts 108a using a PECVD process. In some embodiments, first dielectric layer 107 may include silicon dioxide-based dielectric material with a thickness of from about 700 nm to about 1.2 µm. Preferably, first dielectric layer 107 may have a thickness of 800 nm. Then, the method may further include planarizing first dielectric layer 107.

Figure 7:
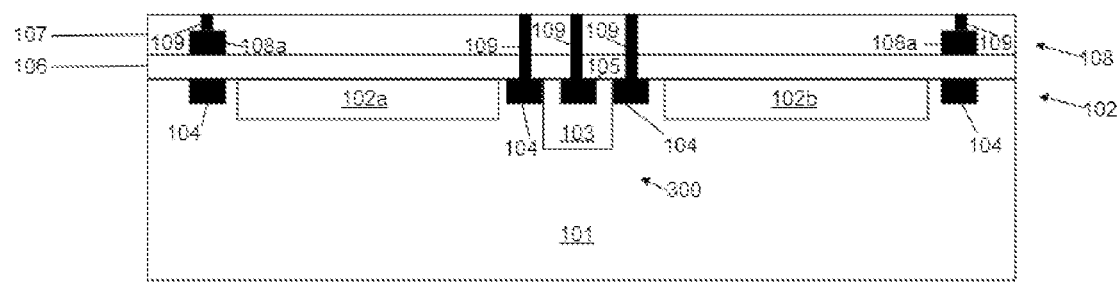

As shown in FIG. 7, the method may further include forming metal vias 109 for providing interconnections between adjacent layers. Specifically, via holes are formed at areas intended for metal vias 109 in first dielectric layer 107 using an etch process, such as a dry etch process, a reaction ion etch (RIE) process. In some embodiments, some via holes are formed to reach polysilicon contact 108a in polysilicon layer 108, while some via holes are formed through first dielectric layer 107 and field oxide layer 106 to reach central n-type pickup 105 and p-type pickup 104 in substrate 101. Subsequently, a layer of tungsten is deposited over first dielectric layer 107 to fill in the via holes using a metal-organic chemical vapor deposition (MOCVD) process. Then the excess tungsten is removed from the upper surface of first dielectric layer 107 using a CMP process. In some embodiments, some metal vias 109 are electrically coupled to polysilicon contacts 108a in polysilicon layer 108, and some metal vias 109 are electrically coupled to central n-type pickup 105 and p-type pickup 104 in the underlying substrate 101 through field oxide layer 106.

Figure 8:
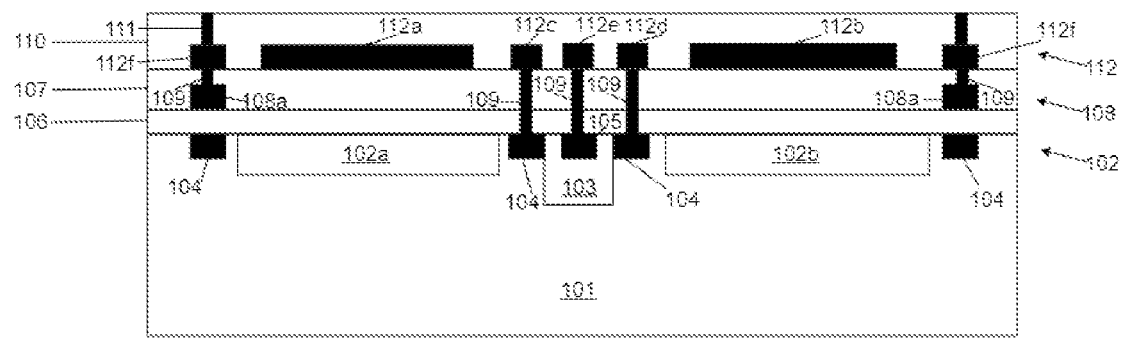

As shown in FIG. 8, the method may further include forming bottom metal layer 112 above polysilicon layer 108. For example, the method further includes forming bottom metal layer 112 on first dielectric layer 107. Specifically, a layer of metallic materials, such as aluminum-based metallic materials, is deposited on first dielectric layer 107 using a PECVD process. Then an etch process, such as, a plasma etch, is performed using a patterned mask covering the areas intended for first bottom metal plate 112a, second bottom metal plate 112b, and metal contacts 112c-112f to remove the exposed portion of the layer of metallic material. Then the patterned mask may be removed by a dry plasma etching process or a CMP process, leaving first bottom metal plate 112a, second bottom metal plate 112b, and metal contacts 112c-112f. Next, the method may further include forming a bottom dielectric layer 110 on bottom metal layer 112 and between first bottom metal plate 112a, second bottom metal plate 112b, and metal contacts 112c-112f. Optionally, a CMP process may be performed on bottom dielectric layer 110 to planarize the same. Metal vias 111 could then be formed using similar process like those used for forming metal vias 109. In some embodiments, some metal vias 111 are electrically coupled to metal contacts 112f.

Figure 9:
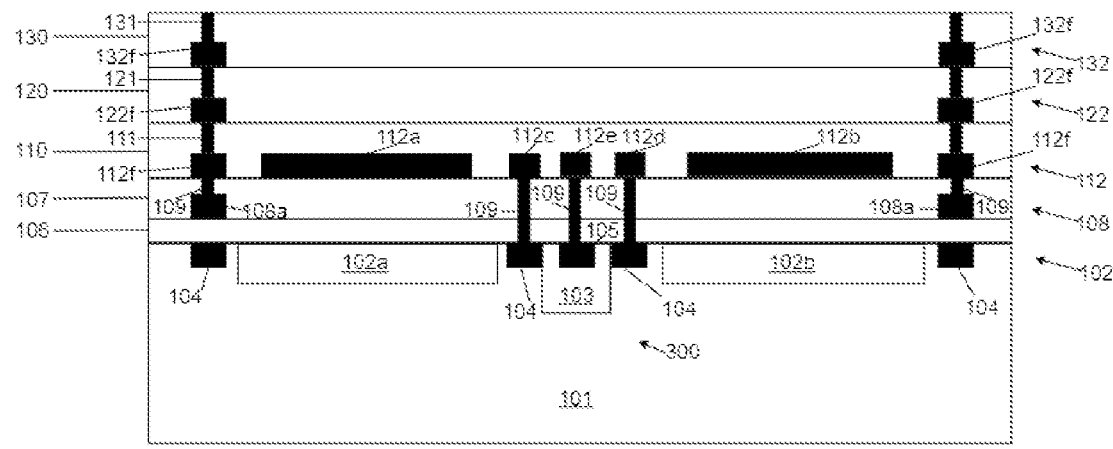

As shown in FIG. 9, the method may further include forming one or more lower metal layers and lower dielectric layers over bottom dielectric layer 110. In some embodiments, the method may include forming lower metal layer 122 and lower dielectric layer 120, lower metal layer 132 and lower dielectric layer 130. It should be noted that these lower metal layers 122 and 132 could be formed using similar processes as those used for forming bottom metal layer 112, while these lower dielectric layers 120 and 130 could be formed using similar processes as those used for forming bottom dielectric layer 110. For example, a layer of metallic materials, such as aluminum-based metallic materials, is deposited on bottom dielectric layer 110 using a PECVD process. Then an etch process, such as, a plasma etch, is performed using a patterned mask covering the areas intended for metal contacts 122f to remove the exposed portion of the layer of metallic material. Then the patterned mask may be removed by a dry plasma etching process or a CMP process, leaving metal contacts 122f. Next, the method may further include forming a lower dielectric layer 120 on lower metal layer 122 and between metal contacts 122f. Optionally, a CMP process may be performed on lower dielectric layer 120. Metal vias 131 could then be formed using similar processes like those used for forming metal vias 111. In some embodiments, metal vias 131 are electrically coupled to metal contacts 122f. It should be noted the number of lower metal layers and lower dielectric layers is determined by the desired capacitance of first and second capacitive isolators 100 and 200.

Figure 10:
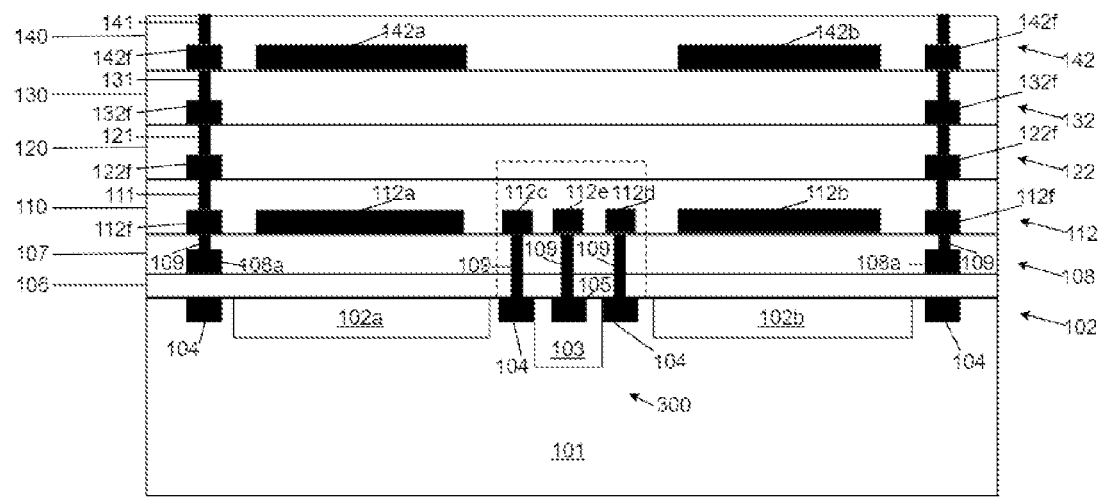

As shown in FIG. 10, the method may further include forming intermediate metal layer 142 and intermediate dielectric layer 140 on the one or more lower dielectric layers. For example, intermediate metal layer 142 is formed on lower dielectric layer 130. Then intermediate dielectric layer 140 is formed on intermediate metal layer 142. It should be noted that intermediate metal layer 142 could be formed using similar processes as those used for forming bottom metal layer 112, while intermediate dielectric layer 140 could be formed using similar processes as those used for forming bottom dielectric layer 110. For example, a layer of metallic material, such as aluminum-based metallic materials, is deposited on lower dielectric layer 130 using a PECVD process. Then an etch process, such as, a plasma etch, is performed using a patterned mask covering the areas intended for metal contacts 142f to remove exposed portion of the layer of metallic material. Then the patterned mask may be removed by a dry plasma etching process or a CMP process, leaving metal contacts 142f. Next, the method may further include forming an intermediate dielectric layer 140 on intermediate metal layer 142 and between metal contacts 142f. Optionally, a CMP process may be performed on intermediate dielectric layer 140. Metal vias 141 could then be formed using similar processes like those used for forming metal vias 111. In some embodiments, metal vias 141 are electrically coupled to metal contacts 142f.

Figure 11:
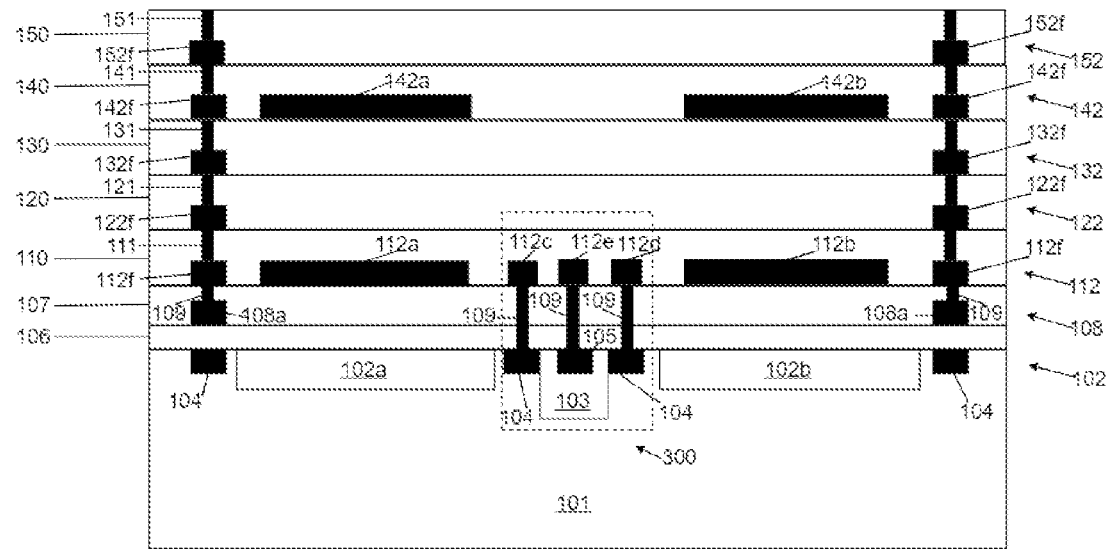

As shown in FIG. 11, the method may further include forming one or more upper metal layers and upper dielectric layers above intermediate metal layer 142. For example, the method may include forming upper metal layer 152 on intermediate dielectric layer 140. Then upper dielectric layer 150 is formed on upper metal layer 152. It should be noted that upper metal layer 152 could be formed using similar processes as those used for forming bottom metal layer 112, while upper dielectric layer 150 could be formed using similar process as those used for forming bottom dielectric layer 110. For example, a layer of metallic materials, such as aluminum-based metallic materials, is deposited on intermediate dielectric layer 140 using a PECVD process. Then an etch process, such as, a plasma etch, is performed using a patterned mask covering the areas intended for metal contacts 152f to remove the exposed portion of the layer of metallic material. Then the patterned mask may be removed by a dry plasma etching process or a CMP process, leaving metal contacts 152f. Next, the method may further include forming upper dielectric layer 150 on upper metal layer 152 and between metal contacts 152f. Optionally, a CMP process may be performed on upper dielectric layer 150. Metal vias 151 could then be formed using similar processes like those used for forming metal vias 111. In some embodiments, metal vias 151 are electrically coupled to metal contacts 142f. The above process for forming upper metal layer 152 and upper dielectric layer 150 could be repeated for desired times for forming additional upper metal layers and additional upper dielectric layers until the desired capacitance of first capacitive isolator 100 or second capacitive isolator 200 has been satisfied. It should also be noted that first capacitive isolator 100 and second capacitive isolator 200 can omit the one or more upper metal layers and upper dielectric layers. In this case, the process for forming these one or more upper metal layers and upper dielectric layers as illustrated with reference to FIG. 11 could be omitted. Such a variation still falls into the protection scope of the present invention.

Figure 12:
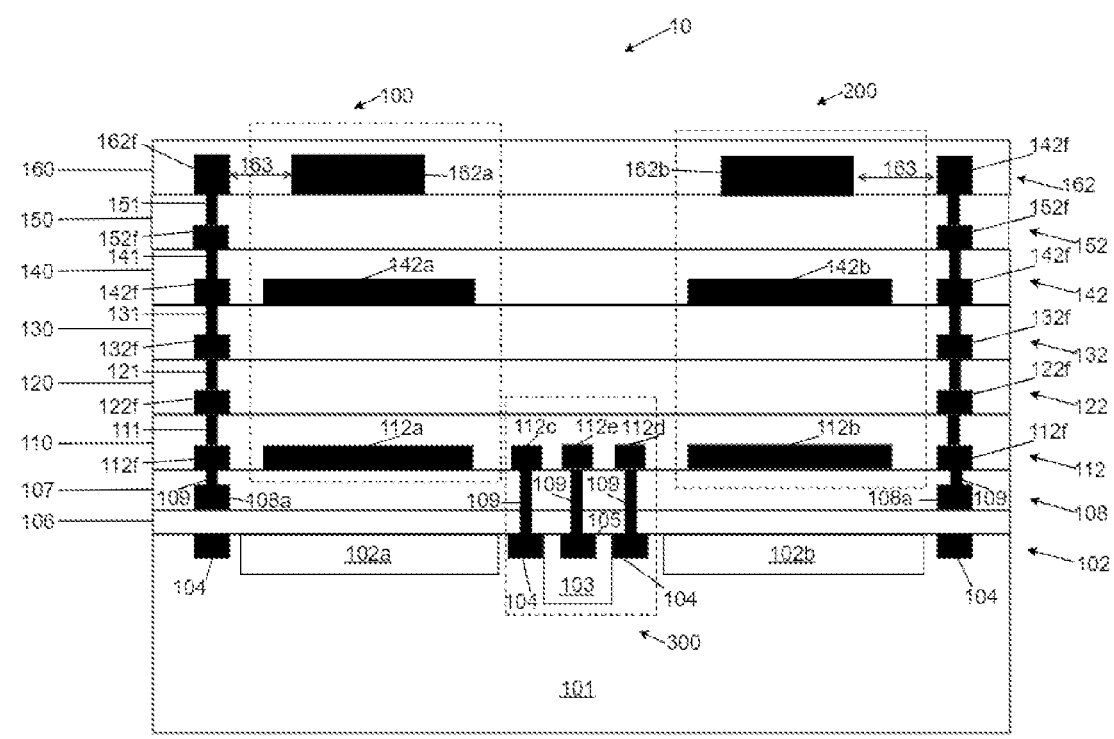

As shown in FIG. 12, the method may further include forming a top metal layer 162 and a top dielectric layer 160 over the one or more upper dielectric layers. In those embodiments that omit the one or more upper metal layers and upper dielectric layers, the method may include forming a top metal layer 162 and a top dielectric layer 160 over intermediate metal layer 142 and intermediate dielectric layer 140. For example, the method may include forming top metal layer 162 on upper dielectric layer 150. Then top dielectric layer 160 is formed on top metal layer 162. It should be noted that top metal layer 162 could be formed using similar processes as those used for forming bottom metal layer 112, while top dielectric layer 160 could be formed using similar processes as those used for forming bottom dielectric layer 110. For example, a layer of metallic material, such as aluminum-based metallic materials, is deposited on upper dielectric layer 150 using a PECVD process. Then an etch process, such as, a plasma etch, is performed using a patterned mask covering the areas intended for metal contacts 162f to remove the exposed portion of the layer of metallic material. Then the patterned mask may be removed by a dry plasma etching process or a CMP process, leaving metal contacts 162f. Next, the method may further include forming top dielectric layer 160 on top metal layer 162 and between metal contacts 162f. Optionally, a CMP process may be performed on top dielectric layer 160.

Figure 13:
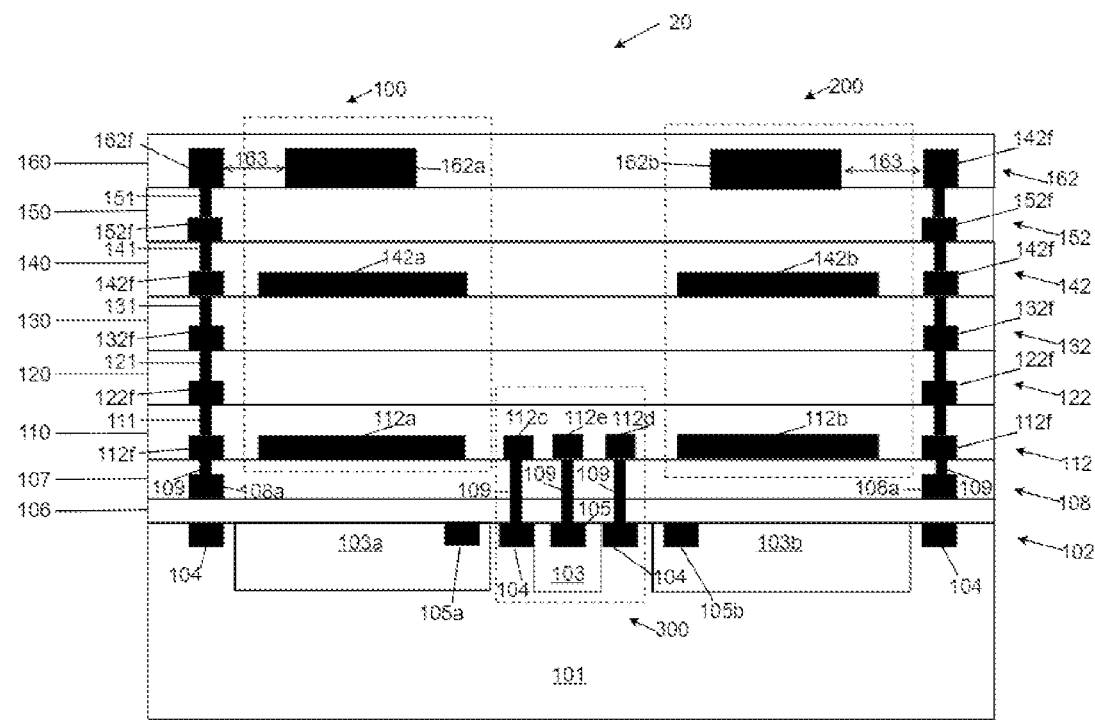
FIG. 13 is a cross-section of a semiconductor device according to some embodiments of the present invention.

FIG. 13 is a cross-section of a semiconductor device 20 according to some embodiments of the present invention. The difference between semiconductor device 20 and semiconductor device 10 shown in FIG. 3A lies in that first shallow trench isolation region 102a and a second shallow trench isolation region 102b of semiconductor device 10 have been replaced respectively by first isolation n-type well 103a and second isolation n-type well 103b. Additionally, a first isolation n-type pickup 105a is formed in first isolation n-type well 103a, and a second isolation n-type pickup 105b is formed in second isolation n-type well 103b. In some embodiments, first isolation n-type well 103a and second isolation n-type well 103b may be electrically coupled to a high voltage through first isolation n-type pickup 105a and second isolation n-type pickup 105b respectively to reduce the signal interference between signals coupled to first and second capacitive isolators 100 and 200. Preferably, first isolation n-type pickup 105a and second isolation n-type pickup 105b may be electrically coupled to a high voltage through a large resistor, the resistance of which can be selected according to the particular application. It should be noted that the description about semiconductor device 10 with reference to FIG. 3A equally apply to semiconductor device 20 except the above mentioned differences. For avoiding duplication of the description, the rest of the structure details of semiconductor device 20 is omitted.

Figure 2B:
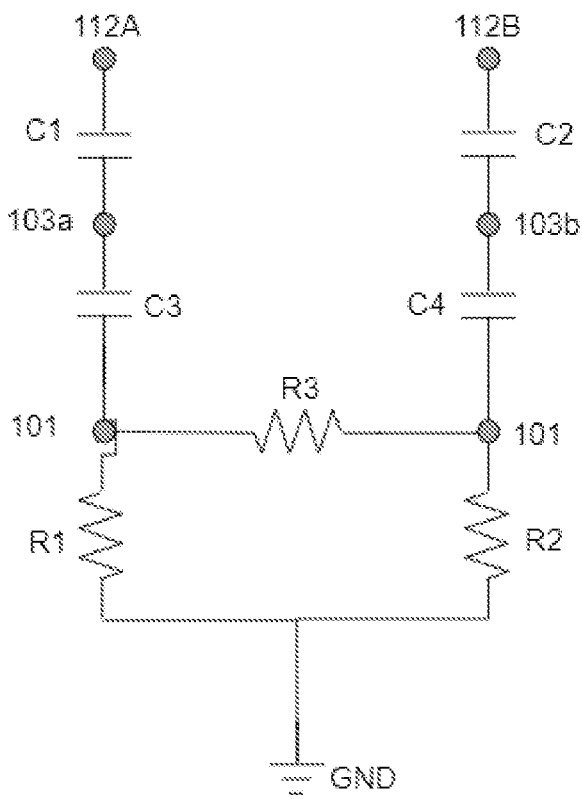

FIG. 2B is a simplified circuit diagram showing the parasite resistances and parasite capacitances under the lower metal plate of the capacitive isolator according to some embodiments of the present invention. Specifically, FIG. 2B shows the equivalent circuit of the area between the bottom metal plate of the capacitive isolator and the substrate according to semiconductor device 20 shown in FIG. 13. As shown in FIG. 2B, capacitor C1 represents the parasite capacitance between first bottom metal plate 112a of first capacitive isolator 100 and the first isolation n-type well 103a, and capacitor C2 represents the parasite capacitance between second bottom metal plate 112b of second capacitive isolator 200 and second isolation n-type well 103b. As shown in FIG. 2B, capacitor C3 represents the parasite capacitance between first isolation n-type well 103a and underlying substrate 101, and capacitor C4 represents the parasite capacitance between second isolation n-type well 103b and underlying substrate 101. Resistance R1 represents the resistance between the first isolation n-type well 103a and outside circuit ground GND, while resistance R2 represents the resistance between the second isolation n-type well 103b and outside circuit ground GND. Resistance R3 represents the resistance between first isolation n-type well 103a and second isolation n-type well 103b. In this configuration, the equivalent capacitance $C_{eq}$ between first bottom metal plate 112a and second bottom metal plate 112b can be determined by equation (1) as follows:

$$C_{eq}=C_1C_3/C_1+C_3=C_2C_4/C_2+C_4 \qquad (1)$$

When first isolation n-type pickup 105a and second isolation n-type pickup 105b are biased to a high level through a large resistor, the capacitance of capacitors C3 and C4 can be reduced. In this case, the equivalent capacitance $C_{eq}$ can be reduced to less than that of capacitor C1 or C2. As the equivalent capacitance $C_{eq}$ between first bottom metal plate 112a and second bottom metal plate 112b has been reduced, the quality of signals transmitted through first and second capacitive isolators 100 and 200 can be improved and the interference between signals can be further reduced. Generally, the equivalent capacitance $C_{eq}$ between first bottom metal plate 112a and second bottom metal plate 112b shown in FIG. 13 can be reduced by ⅓ compared with the structure of shown in FIG. 3A. The signal interference occurred in the semiconductor device 20 can be reduced by 30 dB or more.

Figure 14:
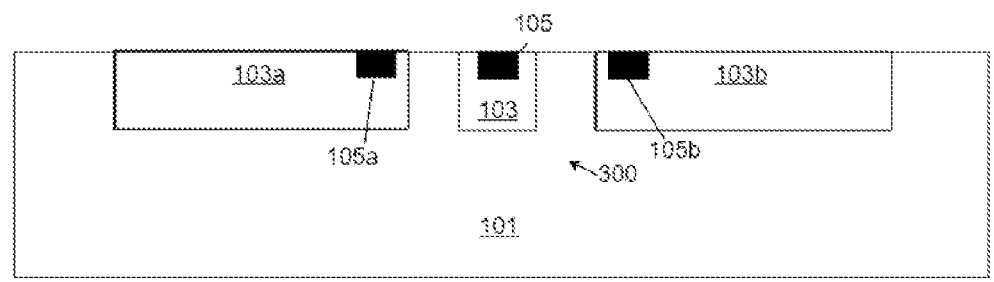
FIGS. 14-15 are cross-sections showing successive stages of the method for fabricating semiconductor device according to some embodiments of the present invention.
Figure 15:
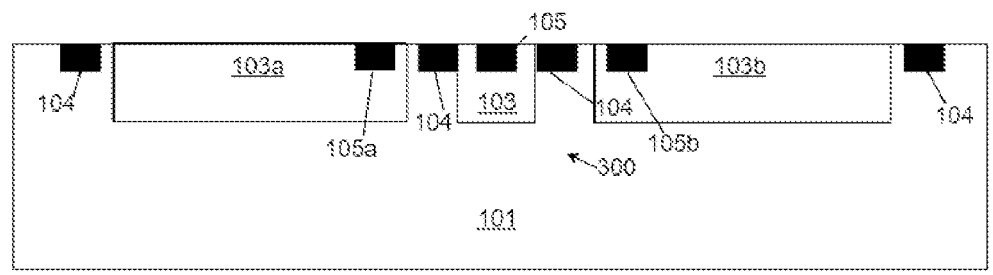

In another aspect of the present invention, a method for fabricating semiconductor device 20 is developed, which is basically similar to the method for fabricating semiconductor device 10 with reference to FIGS. 4-12. The difference lies in the steps illustrated with reference to FIGS. 4 and 5. FIGS. 14 and 15 shows the intermediate stages of the method for fabricating semiconductor device 20 that corresponds to the steps shown in FIGS. 4 and 5.

As shown in FIG. 14, in some embodiments, the method may include providing a substrate 101 and forming central n-type well 103, first isolation n-type well 103a, and second isolation n-type well 103b in substrate 101. Specifically, central n-type well 103, first isolation n-type well 103a, and second isolation n-type well 103b are formed using an ion implantation process with phosphorus ions or arsenic ions having a dopant concentration of from about $1\times10^{15}$ cm$^{-3}$ to about $1\times10^{18}$ cm$^{-3}$. In some embodiments, central n-type well 103 is formed between first isolation n-type well 103a and second isolation n-type well 103b.

As shown in FIG. 15, in some embodiments, the method may then include forming p-type pickup 104, central n-type pickup 105, first isolation n-type pickup 105a, and second isolation n-type pickup 105b in substrate 101. Specifically, p-type pickup 104 is formed using an ion implantation process with boron ions or aluminum ions having a dopant concentration of from about $1\times10^{14}$ cm$^{-3}$ to about $1\times10^{17}$ cm$^{-3}$. Then central n-type pickup 105, first isolation n-type pickup 105a, and second isolation n-type pickup 105b are formed respectively in central n-type well 103, first isolation n-type well 103a, and second isolation n-type well 103b using an ion implantation process with phosphorus ions or arsenic ions having a dopant concentration of from about $1\times10^{15}$ cm$^{-3}$ to about $1\times10^{18}$ cm$^{-3}$. In some embodiments, p-type pickup 104 is formed adjacent to first isolation n-type well 103a and second isolation n-type well 103b. In some embodiments, p-type pickup 104 is formed at either side of central n-type well 103. In some embodiments, p-type pickup 104 is formed as a ring surrounding central n-type well 103.

It should be noted that the steps illustrated with reference to FIGS. 6-12 equally apply to the method for fabricating semiconductor device 30. To avoid duplication, these steps are omitted from description.

While the above is a full description of the specific embodiments, various modifications, alternative constructions and equivalents may be used. Therefore, the above description and illustrations should not be taken as limiting the scope of the present disclosure which is defined by the appended claims.

What is claimed is:

1. A capacitive isolator, comprising:
   a substrate;
   a shallow trench isolation region coupled to the substrate;
   a polysilicon layer disposed above the shallow trench isolation region;
   a bottom metal plate disposed above the polysilicon layer;
   one or more lower dielectric layers above the bottom metal plate;
   an intermediate metal plate disposed above the one or more lower dielectric layers; and
   a top metal plate disposed above the intermediate metal plate; and
   an isolation structure formed in the substrate and coupled to the bottom metal plate, the isolation structure comprising:
      a central n-type well formed in the substrate adjacent to the shallow trench isolation region;
      a central n-type pickup formed within the central n-type well;
      p-type pickups formed at either side of the central n-type well; and
      a first metal contact and a second metal contact formed in a bottom metal layer comprising the bottom metal plate, wherein the p-type pickups are electrically coupled with the first metal contact and the central n-type pickup is electrically coupled with the second metal contact.

2. The capacitive isolator of claim 1, further comprising:
   one or more upper dielectric layers disposed above the intermediate metal plate.

3. The capacitive isolator of claim 1, further comprising:
   a field oxide layer disposed above the substrate, wherein the bottom metal plate is disposed above the field oxide layer.

4. The capacitive isolator of claim 1, wherein the top metal plate has a width less than that of the bottom metal plate.

5. The capacitive isolator of claim 1, wherein the intermediate metal plate has a width equal to or less than that of the bottom metal plate.

6. The capacitive isolator of claim 1, wherein the intermediate metal plate has a width less than that of the bottom metal plate and greater than that of the top metal plate.

7. The capacitive isolator of claim 1, further comprising a bottom dielectric layer disposed on the bottom metal plate.

8. The capacitive isolator of claim 1, further comprising an intermediate dielectric layer disposed on the intermediate metal plate.

9. The capacitive isolator of claim 1, further comprising a passivation layer disposed on the top metal plate.

10. A semiconductor device, comprising
    a substrate, wherein the substrate comprises a first shallow trench isolation region and a second shallow trench isolation region;
    a polysilicon layer disposed above the substrate;
    a bottom metal layer disposed on the polysilicon layer, wherein the bottom metal layer comprises a first bottom metal plate located above the first shallow trench isolation region, and a second bottom metal plate located above the second shallow trench isolation region;
    one or more lower dielectric layers disposed above the bottom metal layer;
    an intermediate metal layer disposed on the one or more lower dielectric layers, wherein the intermediate metal layer comprises a first intermediate metal plate located above the first bottom metal plate and a second intermediate metal plate located above the second bottom metal plate;
    a top metal layer disposed above the intermediate metal layer, wherein the top metal layer comprises a first top metal plate located above the first intermediate metal plate and a second top metal plate located above the second intermediate metal plate; and
    an isolation structure comprising:
    a central n-type well formed in the substrate and between the first shallow trench isolation region and the second shallow trench isolation region;
    a central n-type pickup formed within the central n-type well; and
    p-type pickups formed at either side of the central n-type well;
    wherein the isolation structure further comprises a first metal contact and a second metal contact formed in the bottom metal layer between the first bottom metal plate and the second bottom metal plate, wherein the p-type pickups are electrically coupled with the first metal contact and the central n-type pickup is electrically coupled with the second metal contact.

11. The semiconductor device of claim 10, further comprising:
    one or more upper dielectric layers disposed above the intermediate metal layer.

12. The semiconductor device of claim 10, further comprising:
    a field oxide layer disposed above the substrate, wherein the bottom metal layer is disposed above the field oxide layer.

13. The semiconductor device of claim 10, wherein the first top metal plate has a width less than that of the first bottom metal plate.

14. The semiconductor device of claim 10, wherein the first intermediate metal plate has a width equal to or less than that of the first bottom metal plate.

15. The semiconductor device of claim 10, wherein the first intermediate metal plate has a width less than that of the first bottom metal plate and greater than that of the first top metal plate.

16. The semiconductor device of claim 10, further comprising a bottom dielectric layer disposed on the bottom metal layer.

17. The semiconductor device of claim 10, further comprising an intermediate dielectric layer disposed on the intermediate metal layer.

18. The semiconductor device of claim 10, further comprising a passivation layer disposed on the top metal layer.

19. A capacitive isolator, comprising:
    a substrate;
    an isolation n-type well coupled to the substrate;
    a polysilicon layer disposed above the isolation n-type well;
    a bottom metal plate disposed above the polysilicon layer;
    one or more lower dielectric layers above the bottom metal plate;
    an intermediate metal plate disposed above the one or more lower dielectric layers; and
    a top metal plate disposed above the intermediate metal plate; and an isolation structure formed in the substrate and comprising the isolation n-type well, the isolation structure further comprising:
- a central n-type pickup formed within the isolation n-type well;
- p-type pickups formed at either side of the isolation n-type well; and
- a first metal contact and a second metal contact formed in a bottom metal layer comprising the bottom metal plate, wherein the p-type pickups are electrically coupled with the first metal contact and the central n-type pickup is electrically coupled with the second metal contact.

\* \* \* \* \*